United States Patent [19]
Taniguchi et al.

[11] Patent Number: 6,054,501
[45] Date of Patent: Apr. 25, 2000

[54] PHOTOPOLYMERIZATION INITIATOR AND ENERGY RAY CURABLE COMPOSITION CONTAINING THE SAME

[75] Inventors: Nobuo Taniguchi, Urawa; Minoru Yokoshima, Toride, both of Japan

[73] Assignee: Nippon Kayaku Kabushiki Kaisha, Tokyo, Japan

[21] Appl. No.: 09/011,371

[22] PCT Filed: May 30, 1997

[86] PCT No.: PCT/JP97/01851

§ 371 Date: Mar. 9, 1998

§ 102(e) Date: Mar. 9, 1998

[87] PCT Pub. No.: WO97/47660

PCT Pub. Date: Dec. 18, 1997

[30] Foreign Application Priority Data

| Jun. 12, 1996 | [JP] | Japan | 8-171621 |
| Jun. 18, 1996 | [JP] | Japan | 8-177309 |
| Aug. 20, 1996 | [JP] | Japan | 8-235841 |

[51] Int. Cl.$^7$ .................................................. C08F 2/46
[52] U.S. Cl. .................... 522/31; 522/100; 522/81; 522/75; 522/909; 522/170; 522/181; 522/31.6; 522/31.86; 522/31.28
[58] Field of Search ................ 522/31, 25, 100, 522/81, 75, 909, 170, 181; 106/31.28, 31.6, 31.86

[56] References Cited

U.S. PATENT DOCUMENTS

| 4,026,705 | 5/1977 | Crivello et al. | 430/280.1 |
| 4,835,193 | 5/1989 | Hayase et al. | 522/15 |
| 4,950,581 | 8/1990 | Koike et al. | 430/281.1 |
| 4,987,158 | 1/1991 | Eckberg | 522/31 |
| 5,073,643 | 12/1991 | Crivello | 556/64 |
| 5,168,032 | 12/1992 | Okamoto et al. | 430/281.1 |
| 5,326,621 | 7/1994 | Palazzotto et al. | 428/195 |
| 5,500,453 | 3/1996 | Toba et al. | 522/25 |
| 5,545,676 | 8/1996 | Palazzotto et al. | 522/15 |
| 5,554,664 | 9/1996 | Lamanna et al. | 522/25 |
| 5,583,194 | 12/1996 | Crivello et al. | 528/15 |
| 5,631,307 | 5/1997 | Tanaka et al. | 522/25 |
| 5,639,802 | 6/1997 | Neckers et al. | 522/25 |
| 5,750,590 | 5/1998 | Schaefer et al. | 523/115 |
| 5,783,358 | 7/1998 | Schulthess et al. | 430/269 |

FOREIGN PATENT DOCUMENTS

| 8-165290 | 6/1996 | Japan . |
| 10152554 | 6/1998 | Japan . |
| 10279658 | 10/1998 | Japan . |

OTHER PUBLICATIONS

William R. Watt. UV Curing of Epoxides by Cationic Polymerization. Chapter 6, pp. 248–279.

J.V. Crivello. Cationic Polymerization–Iodonium and Sulfonium Salt Photoinitiators. Advances in Polymer Science. vol. 62, pp. 3–44 (1984).

C. G. Roffey. Photopolymerization of Surface Coatings. Chapter 3. pp. 67–136.

*Primary Examiner*—James J. Seidleck
*Assistant Examiner*—Sanza L. McClendon
*Attorney, Agent, or Firm*—Nields, Lemack & Dingman

[57] ABSTRACT

This invention provides an energy ray curable composition which has excellent curability. The composition contains a cationic polymerizable substance, a photopolymerization initiator comprised of a specified onium salt and a pigment as occasion demands. The curable composition is excellent in curability, and cured paint films obtained therefrom shows excellent glossiness. This composition can be blended in white inks, printing inks, paints, resist inks, wood fillers and the like.

17 Claims, No Drawings

PHOTOPOLYMERIZATION INITIATOR AND ENERGY RAY CURABLE COMPOSITION CONTAINING THE SAME

TECHNICAL FIELD

This invention relates to a novel energy ray curable composition which may contain a pigment and to cured products thereof. More illustratively, it relates to an energy ray curable composition which has excellent curability, particularly a composition which contains a pigment and has excellent curability, and to cured products thereof.

BACKGROUND ART

Based on the energy saving, space saving, non-polluting and the like requirements which have been called for in the printing ink, paint, coating, liquid resist ink and the like fields, extensive studies on photopolymerizable compositions and materialization efforts thereof have been made. The majority of these studies, however, have been based on the radical polymerization reaction of double bond. Though cationic polymerizable substances such as epoxy resins are excellent materials in terms of physical properties, it is difficult to effect their photopolymerization, so that materials in which double bonds are introduced by acrylic modification are mainly used.

In order to effect photo-curing of epoxy resins, a method has been proposed for example in U.S. Pat. No. 3,794,576 in which an epoxy resin is polymerized by using a photosensitive aromatic diazonium salt as a photopolymerization initiator and releasing a Lewis acid from the photopolymerization initiator by decomposing it with light irradiation. However, the aromatic diazonium salt releases not only Lewis acid but also nitrogen gas by its photodecomposition, and the gas causes foaming of a paint film of the epoxy resin when its thickness becomes 15μ or more, so that the salt is not suited for use in thick coating. In addition, its mixture with epoxy resin causes a problem in terms of storage stability, such as gradual progress of hardening even in the absence of light, so that it is difficult to make the mixture into a one-part composition. Thus, various attempts have been made with the aim of overcoming disadvantages of the aforementioned diazonium salt-based initiators, and, as techniques for the improvement of thick coating property and storage stability, aromatic sulfonium salt-based and aromatic iodonium salt-based initiators and curable resin compositions containing the same have been disclosed for example in Japanese Patent Publication No. 52-14278 (1977), Japanese Patent Publication No. 52-14277(1977), Japanese Patent Application Kokai No. 54-53181(1979), Japanese Patent Publication No. 59-19581(1984) and Japanese Patent Application Kokai No. 56-55420(1981). However, these colored compositions are poor in curability, and its improving means have not been proposed. In addition, with the expansion of fields in which photopolymerizable compositions are used, it becomes important to provide a novel composition in order to meet the needs of the market.

DISCLOSURE OF THE INVENTION

With the aim of resolving the aforementioned problems, the inventors of the present invention have conducted intensive studies and succeeded in providing an energy ray curable composition having excellent curability and cured products thereof.

Accordingly, the present invention relates to an energy ray curable composition which comprises (1) a cationic polymerizable substance (A);
(2) a photopolymerization initiator (B) which is an onium salt having a maximum molar absorption coefficient of 50 or more at a wave length of 360 nm or more, or a combined photopolymerization initiator of (B) with a polymerization initiator (B') which is an onium salt having a maximum molar absorption coefficient of 10,000 or more at a wave length of 360 nm or less; and if necessary
(3) a pigment (C), and to ink or paint containing the same and cured products thereof.

The molar absorption coefficient is calculated based on the following formula after dissolving each onium salt in an appropriate solvent (methanol or the like for example) and measuring its absorbance at a wave length (nm) within the range of from 200 nm to 500 nm with a spectrophotometer.

$$A = \epsilon \cdot C \cdot d$$

(A: absorbance, $\epsilon$: molar absorption coefficient, c: molar concentration (mol/l), d: thickness (cm))

The maximum molar absorption coefficient at a wave length of 360 nm or less is calculated from the maximum value of absorbance at a wave length (nm) within the range of from 200 nm to 360 nm according to the above method. In the same manner, the maximum molar absorption coefficient at a wave length of 360 nm or more is calculated from the maximum value of absorbance at a wave length (nm) within the range of from 360 nm to 500 nm.

As the cationic polymerizable substance (A) to be used in the present invention, the following three types of epoxy resins which are generally curable at ordinary atmospheric temperature can be exemplified.

The first group has a structural formula (1):

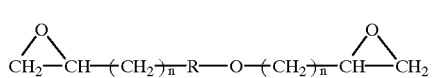

(1)

(in the formula (1), n is a number of 1 to 3 and R is an aliphatic or alicyclic group having 5 to 12 carbon atoms).

The second group include epoxy carbocyclic ethers having a structural formula (2):

(2)

In this case, $R^1$ may be either mononucleic or polynucleic but is an epoxidized carbocyclic group having 4 to 12 carbon atoms in its ring structure. Also, $R^2$ is a $C_1$–$C_3$ alkyl group and $R^3$ may be the same as $R^1$ or an epoxy group having the following general structural formula (3).

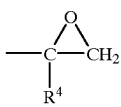

(3)

In the above formula, $R^4$ is hydrogen atom, a $C_1$–$C_3$ alkyl group or phenyl group. Such an alkyl group or phenyl group may or may not have a substituent group. Also, a=0 or 1 and n=1 to 3.

The third group includes epoxy esters, each having at least two epoxidized cyclic alkyl groups.

Cationic polymerizable substances suited for the present invention are described in detail by Pappas in "UV CURING; SCIENCE AND TECHNOLOGY" (Connecticut, Stanford Technology Marketing Corporation) and by Crivello in U.S. Pat. Nos. 4,150,988, 4,102,687 and 4,069,056.

The cationic polymerizable substance (A) consists at least of an epoxy resin as the main component which is a substance in the monomer or oligomer form having at least one functional epoxy group such that polymerization can be effected by the ring-opening of oxirane ring or having at least one functional epoxy group or oxirane ring such that polymerization can be effected by the ring-opening of oxirane ring. An epoxy compound in a polymer form may also be used, with the proviso that it can be dispersed in the composition and can give a solid polymer by polymerization or cross-linking. The epoxy compound may be aliphatic, alicyclic, aromatic or heterocyclic.

It is desirable to use epoxy resins alone or in combination as the polymerizable epoxy compound, and they may have an average epoxy equivalent value of preferably from about 50 to 5,000. The carbon chain having an epoxy group may have other substituent groups such as ethers, esters, halogens, phosphoric esters and the like, and these compounds may have other polymerizable functional groups such as acrylic esters, silicones and the like. Oxetane compounds and the like can also be used.

Examples of typical epoxy compounds which are well known and commercially available include a reaction product of bisphenol A with epichlorohydrin, a reaction product of phenol.novolak or cresol.novolak with epichlorohydrin, an aliphatic glycidyl ether compound and an alicyclic epoxy compound such as 3,4-epoxycyclohexylmethyl-3,4-epoxycyclohexane carboxylate, bis(3,4-epoxycyclohexyl) adipate, vinylcyclohexene dioxide, 2-[3,4-epoxycyclohexyl-5,5-spiro-3,4-epoxy]cyclohexane-metadioxane, 1,2-epoxy-p-vinylcyclohexene or the like.

Examples of desirable cationic polymerizable substance (A) other than the aforementioned epoxy resins include vinyl type compounds such as styrene and the like vinyl type aromatic hydrocarbons, isobutyl ether, n-octyl vinyl ether, 2-hydroxyethyl vinyl ether, 2-chloroethyl vinyl ether, cyclohexyl-1,4-dimethylol monovinyl ether, triethylene glycol divinyl ether, tetraethylene glycol divinyl ether, trimethylolpropane trivinyl ether, tricyclodecanedimethylol divinyl ether, polyurethane polyvinyl ethers, polyester polyvinyl ethers, phenol.novolak polyvinyl ethers and the like vinyl ethers; acrolein; 1-vinylpyrene, acenaphthalene and the like vinylallenes; vinylcyclohexane and the like vinyl alicyclic compounds; and isobutylene, butadiene, isoprene and the like conjugated dienes. Also useful are oxetanes and oxorans (for example, tetrahydrofuran and trioxan). Other types of compounds include β-lactones, such as propiolactone and the like cyclic esters, and 1,3,3-trimethylazetidine or the like cyclic amine. Another types of cationic polymerizable substance include hexamethyltrisiloxane and the like cyclic organic silicon compounds. Also, examples of substances useful as still another types of cationic polymerizable substance include a urea/formaldehyde resin, a phenol/formaldehyde resin, a melamine/formaldehyde resin and the like thermosetting aldehyde condensation-type organic resins as described by Crivello in U.S. Pat. No. 4,102,687 dated Jul. 15, 1978.

According to the present invention, an onium salt having a maximum molar absorption coefficient of 50 or more at a wave length of 360 nm or more is used as the photocationic polymerization initiator (B). Examples of the photocationic polymerization initiator (B) include a sulfonium salt having a thioxanthone structure, a sulfonium salt having an anthraquinone structure, a sulfonium salt having an acridone structure and the like.

Examples of the sulfonium salt having a thioxanthone structure include thioxanthone based sulfonium salts represented by the following formula (4):

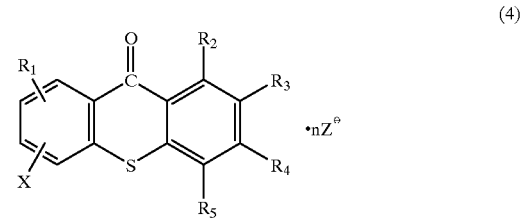

(4)

{wherein X is a group represented by the following formula (5)

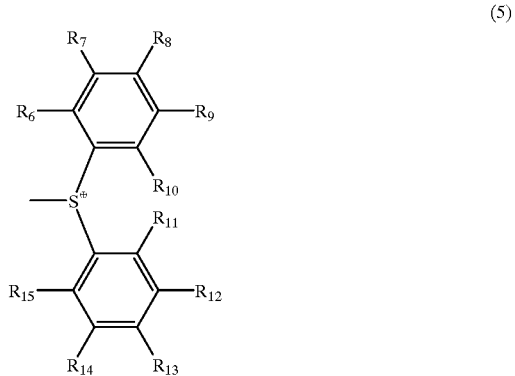

(5)

(wherein each of $R_6$ to $R_{15}$ is a group selected from a hydrogen atom, a halogen atom, a nitro group, an alkoxy group, an aliphatic group having a $C_1$–$C_{20}$ structure which may have a hydroxyl group, an ether group, an ester group, a (meth)acryloyl group, an epoxy group or an allyl group, a phenyl group, a phenoxy group and a thiophenoxy group), each of $R_1$ to $R_5$ is a group selected from a hydrogen atom, a hydroxyl group, a $C_1$–$C_{15}$ aliphatic group, a halogen atom, a nitro group, an alkoxy group, a phenyl group and a group represented by the formula (5), n is 1 to 4, Z is an anion represented by a formula (6):

$$MQ_{p-m}(OH)_m \quad (6)$$

(wherein M is a phosphorus atom, an arsenic atom or an antimony atom, Q is a halogen atom, p is an integer of 4 to 6 and m is 0 or 1) or by a formula (7):

$$BY_aP_b \quad (7)$$

(wherein B is a boron atom, a and b are integers within the range of from 0 to 4, wherein a+b=4, Y is a halogen atom or a hydroxyl group and P is a phenyl group substituted with at least one electron attractive group or at least two halogen atoms), and n is 1 or 2}.

The sulfonium salt represented by the formula (4) can be synthesized for example by 1) a method in which a thioxanthone compound represented by a general formula (8)

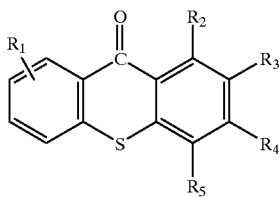

(wherein each of $R_1$ to $R_5$ is a group selected from a hydrogen atom, a hydroxyl group, a $C_1$–$C_{15}$ aliphatic group, a halogen atom, a nitro group, an alkoxy group, an ester group and a phenyl group) is allowed to react with a substituted or unsubstituted diphenyl sulfoxide compound making use of a known sulfonyl salt forming reaction (to be referred to as method 1) hereinafter) or 2) a method in which a corresponding substituted or unsubstituted sulfonium salt is synthesized in advance and then a substituent group is converted or introduced (to be referred to as method 2) hereinafter).

Firstly, the method 1) is illustratively described. The sulfonium salt can be obtained by carrying out condensation reaction of a thioxanthone compound represented by the formula (8) (its illustrative examples include 2,4-diethylthioxanthone, 2,4-dipropylthioxanthone, 2-isopropylthioxanthone, 4-isopropylthioxanthone, 2-chlorothioxanthone, 1-chloro-4-propoxythioxanthone, 2-hydroxy-3,4-dimethylthioxanthone, 1-methoxythioxanthone, 2-methoxythioxanthone, 3-methoxythioxanthone, 4-methoxythioxanthone, 1-methyl-4-hydroxythioxanthone, 1-methyl-4-chlorothioxanthone, 1,2-dimethyl-4-chlorothioxanthone, 1,3-dimethyl-4-chlorothioxanthone, 2,3,4-trimethylthioxanthone, 3-nitrothioxanthone, 3-ethoxythioxanthone, 1,3,4-trimethyl-2-oxycarbonylmethylthioxanthone, 2-oxycarbonylmethyl-4-methylthioxanthone, 2-phenylthioxanthone, 1-carbonyloxymethylthioxanthone, 1-carbonyloxyethyl-3-nitrothioxanthone, 1-carbonyloxyethyl-2-ethoxythioxanthone and the like) with a substituted or unsubstituted diphenyl sulfoxide compound (for example, diphenylsulfoxide, 4,4'-difluorodiphenyl sulfoxide, 2,2'-difluorodiphenyl sulfoxide, 3,3'-difluorodiphenyl sulfoxide, 4,2'-difluorodiphenyl sulfoxide, 4,4'-dibromodiphenyl sulfoxide, 4,4'-dichlorodiphenyl sulfoxide, 2,2',4,41'-tetrachlorodiphenyl sulfoxide, 4,4'-dimethyldiphenyl sulfoxide, 4,4'-diethyldiphenyl sulfoxide, 4,4'-dimethoxydiphenyl sulfoxide, 4,4'-diethyldiphenyl sulfoxide, 4-methylthiodiphenyl sulfoxide, 4-phenylthiodiphenyl sulfoxide or the like) by a known method, for example in a dehydrating agent (for example, phosphorus pentaoxide, concentrated sulfuric acid, acetic anhydride or the like) at ordinary temperature to 100° C., and then adding the resulting reaction solution dropwise to an aqueous solution of a compound of formula (6) or (7) (for example, $NaSbF_6$, $NaPF_6$, $NaAsF_6$, $NaBF_4$, $NaSbF_{5OH}$, $KSbF_6$, $KPF_6$, $KAsF_6$, $KSbF_5OH$, $NaB(C_6F_5)_4$, $LiB(C_6F_5)_4$, $LiB(C_6F_5)_2F_2$, $LiB(C_6H_4CF_3)_4$, $LiBF_3(C_6F_5)$ or the like).

In illustratively describing the method 2), a sulfonium salt synthesized by the method 1), for example a halide compound represented by a formula (9)

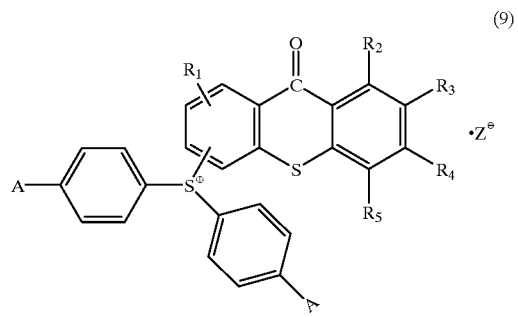

(wherein $R_1$ to $P_5$ are the same as the $R_1$ to $P_5$ of the formula (8), A is a halogen atom, and Z is as defined by the aforementioned formula (6) or (7)), is allowed to react with a large excess of a mono or polyalcohol (for example, methanol, ethanol, carbitol, ethylene glycol, polyethylene glycol, propylene glycol, glycerol, trimethylolpropane, 1,4-butanediol, glycidol, 2-hydroxyethyl (meth)acrylate, 2-hydroxypropyl (meth)acrylate, allyl alcohol or the like) by a known method, for example in the presence of a basic compound (for example, sodium hydroxide, potassium hydroxide, potassium carbonate or the like) at room temperature to 150° C., if necessary in the presence of dimethyl sulfoxide or the like organic solvent, thereby obtaining a sulfonium salt in which the halide moiety of the aforementioned halide compound is substituted for example with

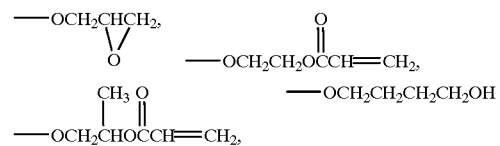

or the like substituent group. Though not particularly limited, the compounds shown in Table 1 can be cited as typical examples of the compound represented by the general formula (4).

TABLE 1

| No. | $R_1$–$R_5$ | $Z^\ominus$ | n | X ($R_6$–$R_{15}$) |
|---|---|---|---|---|
| 1 | $R_1$, $R_2$, $R_4$ = H<br>$R_3$, $R_5$ = $C_2H_5$ | $PF_6^\ominus$ | 1 | $R_8$, $R_{13}$ = F<br>$R_6$, $R_7$, $R_9$–$R_{12}$,<br>$R_{14}$, $R_{15}$ = H |
| 2 | $R_1$ = X, $R_2$, $R_4$ = H<br>$R_3$, $R_5$ $C_2H_5$ | $SbF_6^\ominus$ | 2 | $R_6$–$R_{15}$ = H |
| 3 | $R_3$ = $(CH_2)_{11}CH_3$ | $SbF_6^\ominus$ | 1 | $R_8$, $R_{13}$ = F |

TABLE 1-continued

| No. | $R_1$~$R_5$ | $Z^\ominus$ | n | X ($R_6$~$R_{15}$) |
|---|---|---|---|---|
|  | $R_1$, $R_2$, $R_4$, $R_5$ = H |  |  | $R_6$, $R_7$, $R_9$~$R_{12}$, $R_{13}$, $R_{15}$ = H |
| 4 | $R_3$ = $(CH_2)_{11}CH_3$<br>$R_1$, $R_2$, $R_4$, $R_5$ = H | $PF_6^\ominus$ | 1 | $R_7$, $R_{14}$ = —OCH$_2$CH—CH$_2$<br>         \\ /<br>          O<br>$R_6$, $R_8$ ~ $R_{13}$, $R_{15}$ = H |
| 5 | $R_3$ = $(CH_2)_{11}CH_3$<br>$R_1$, $R_2$, $R_4$, $R_5$ = H | $SbF_6^\ominus$ | 1 | $R_6$~$R_{15}$ = H |
| 6 | $R_3$ = Cl<br>$R_1$, $R_2$, $R_4$, $R_5$ = H | $SbF_6^\ominus$ | 1 | $R_8$, $R_{13}$ = $OCH_3$<br>$R_6$, $R_7$, $R_9$~$R_{12}$,<br>$R_{14}$, $R_{15}$ = H |
| 7 | $R_1$, $R_3$ = X<br>$R_5$ = —CH(CH$_3$)$_2$<br>$R_2$, $R_4$ = H | $SbF_6^\ominus$ | 3 | $R_6$~$R_{15}$ = H |
| 8 | $R_1$, $R_3$, $R_4$ = H<br>$R_2$ = Cl, $R_5$ = $OC_3H_7$ | $PF_6^\ominus$ | 1 | $R_6$~$R_{15}$ = H |
| 9 | $R_1$, $R_3$, $R_4$ = H<br>$R_2$ = Cl, $R_5$ = $OC_3H_7$ | $PF_6^\ominus$ | 1 | $R_8$, $R_{13}$ =<br>              O<br>              ‖<br>OCH$_2$CH$_2$OCCH=CH$_2$<br>$R_6$, $R_7$, $R_9$ ~ $R_{12}$,<br>$R_{14}$, $R_{15}$= H |
| 10 | $R_1$, $R_3$, $R_4$ = H<br>$R_2$ = Cl, $R_5$ = $OC_3H_7$ | $B(C_6F_5)_4$ | 1 | $R_8$, $R_{13}$ =<br>              O<br>              ‖<br>OCH$_2$CH$_2$OCCH=CH$_2$<br>$R_6$, $R_7$, $R_9$ ~ $R_{12}$,<br>$R_{14}$, $R_{15}$= H |
| 11 | $R_3$ = Cl<br>$R_1$, $R_2$, $R_4$, $R_5$ = H | $PF_6^\ominus$ | 1 | $R_8$, $R_{13}$ = F<br>$R_6$, $R_7$, $R_9$~$R_{12}$,<br>$R_{14}$, $R_{15}$ = H |
| 12 | $R_3$ = Cl<br>$R_1$, $R_2$, $R_4$, $R_5$ = H | $SbF_6^\ominus$ | 1 | $R_8$, $R_{13}$ = F<br>$R_6$, $R_7$, $R_9$~$R_{12}$,<br>$R_{14}$, $R_{15}$ = H |
| 13 | $R_3$ = —CH(CH$_3$)$_2$<br>$R_1$, $R_2$, $R_4$, $R_5$ = H | $PF_6^\ominus$ | 1 | $R_8$, $R_{13}$ = F<br>$R_6$, $R_7$, $R_9$~$R_{12}$,<br>$R_{14}$, $R_{15}$ = H |
| 14 | $R_3$ = —CH(CH$_3$)$_2$<br>$R_1$, $R_2$, $R_4$, $R_5$ = H | $SbF_6^\ominus$ | 1 | $R_8$, $R_{13}$ = F<br>$R_6$, $R_7$, $R_9$~$R_{12}$,<br>$R_{14}$, $R_{15}$ = H |
| 15 | $R_3$ = —CH(CH$_3$)$_2$<br>$R_1$, $R_2$, $R_4$, $R_5$ = H | $B(C_6F_5)_4^\ominus$ | 1 | $R_8$, $R_{13}$ = F<br>$R_6$, $R_7$, $R_9$~$R_{12}$,<br>$R_{14}$, $R_{15}$ = H |

Next, examples of the anthraquinone based sulfonium salt include anthraquinone compounds represented by the following formula (10)

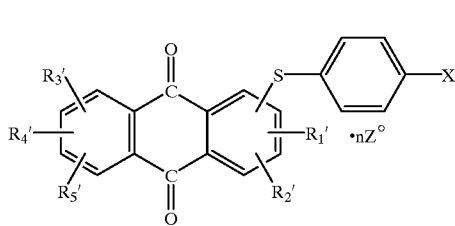

(10)

[wherein X is the group as defined by the aforementioned formula (5), each of $R'_1$ to $R'_5$ is a group selected from a hydrogen atom, a hydroxyl group, a $C_1$–$C_{15}$ aliphatic group, a nitro group, an alkoxy group, a phenyl group and a group represented by a formula (11),

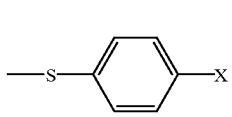

(11)

n is 1 to 4 and Z is as defined by the aforementioned formula (6) or (7)].

The sulfonium salt represented by the formula (10) can be synthesized for example by 1) a method in which an anthraquinone compound represented by a general formula (12)

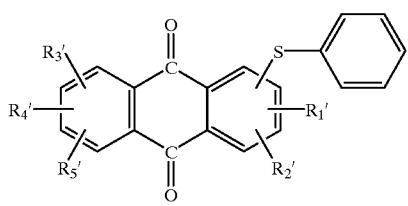

(12)

(wherein each of R'₁ to R'₅ is a group selected from a hydrogen atom, a hydroxyl group, a $C_1$–$C_{15}$ aliphatic group, a nitro group, an alkoxy group, a phenyl group and a thiophenoxy group) is allowed to react with a substituted or unsubstituted diphenyl sulfoxide compound making use of a known sulfonyl salt forming reaction (to be referred to as method 1) hereinafter) or 2) a method in which a corresponding substituted or unsubstituted sulfonium salt is synthesized in advance and then a substituent group is converted or introduced (to be referred to as method 2) hereinafter).

Firstly, the method 1) is illustratively described. The sulfonium salt can be obtained by carrying out condensation reaction of an anthraquinone compound represented by the formula (12) (its illustrative examples include 1-phenylthioanthraquinone, 3-phenylthioanthraquinone, 1-phenylthio-4-methylanthraquinone, 1-ethoxy-3-phenylthioanthraquinone, 1-phenylthio-3,4-dimethylanthraquinone, 1-nitro-4-phenylthioanthraquinone, 1,8-diphenylthioanthraquinone, 1,8-diphenylthio-3-phenylanthraquinone, 1,8-diphenylthio-3,4-diethylanthraquinone and the like) with a substituted or unsubstituted diphenyl sulfoxide compound (for example, diphenylsulfoxide, 4,4'-difluorodiphenyl sulfoxide, 2,2'-difluorodiphenyl sulfoxide, 3,3'-difluorodiphenyl sulfoxide, 4,2'-difluorodiphenyl sulfoxide, 4,4'-dibromodiphenyl sulfoxide, 4,4'-dichlorodiphenyl sulfoxide, 2,2',4,4'-tetrachlorodiphenyl sulfoxide, 4,4'-dimethyldiphenyl sulfoxide, 4,4'-diethyldiphenyl sulfoxide, 4,4'-dimethoxydiphenyl sulfoxide, 4,4'-diethyldiphenyl sulfoxide, 4-methylthiodiphenyl sulfoxide, 4-phenylthiodiphenyl sulfoxide or the like) by a known method, for example in a dehydrating agent (for example, phosphorus pentaoxide, concentrated sulfuric acid, acetic anhydride or the like) at ordinary temperature to 100° C., and then adding the resulting reaction solution dropwise to an aqueous solution of a compound of formula (6) or (7) (for example, NaSbF₆, NaPF₆, NaAsF₆, NaBF₄, NaSbF₅OH, KSbF₆, KPF₆, KAsF₆, KSbF₅OH, LiB(C₆F₅)₄, LiB(C₆F₅)₂F₂, LiB(C₆H₄CF₃)₄, LiBF₃(C₆F₅), NaB(C₆F₅)₄ or the like).

In illustratively describing the method 2), a sulfonium salt synthesized by the method 1), for example a halide compound represented by a formula (13)

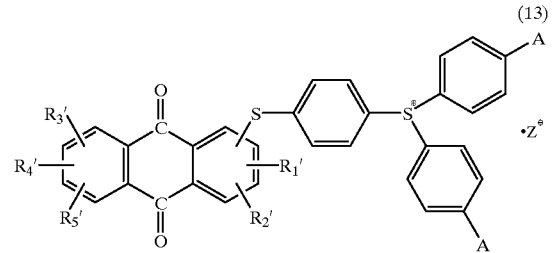

(13)

(wherein each of R₁ to R₅ is a group selected from a hydrogen atom, a $C_1$–$C_{15}$ aliphatic group, a nitro group, an alkoxy group and a phenyl group, Z is as defined by the aforementioned formula (6) or (7) and A is a halogen atom), is allowed to react with a large excess of a mono or polyalcohol (for example, methanol, ethanol, carbitol, ethylene glycol, polyethylene glycol, propylene glycol, glycerol, trimethylolpropane, 1,4-butanediol, glycidol, 2-hydroxyethyl (meth)acrylate, 2-hydroxypropyl (meth)acrylate, allyl alcohol or the like) by a known method, for example in the presence of a basic compound (for example, sodium hydroxide, potassium hydroxide, potassium carbonate or the like) at room temperature to 150° C., if necessary in the presence of dimethyl sulfoxide or the like organic solvent, thereby obtaining a sulfonium salt in which the halide moiety of the aforementioned halide compound is substituted for example with

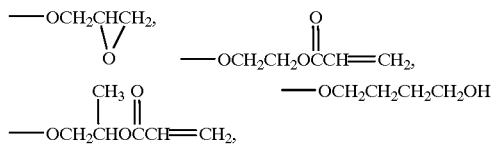

or the like substituent group. Though not particularly limited, the compounds shown in Table 2 can be cited as typical examples of the compound represented by the general formula (13).

TABLE 2

| No. | R'₁~R'₅ | Z⁻ | n | X (R₆~R₁₅) |
|---|---|---|---|---|
| 1' | R'₁~R'₅ = H | PF₆⁻ | 1 | R₆~R₁₅ = H |
| 2' | R'₁~R'₅ = H | SbF₆⁻ | 1 | $R_8, R_1 = $ —OCH₂CH⎯CH₂ (epoxide); $R_6, R_7, R_9 \sim R_{12}, R_{14}, R_{15} = H$ |
| 3' | R'₁~R'₅ = H | SbF₆⁻ | 1 | $R_8, R_{13} = $ —OC₂H₅; $R_6, R_7, R_9 \sim R_{12}, R_{14}, R_{15} = H$ |
| 4' | R'₁~R'₅ = H | SbF₆⁻ | 1 | $R_8, R_{13} = $ Cl; $R_6, R_7, R_9 \sim R_{12}, R_{14}, R_{15} = H$ |

TABLE 2-continued

| No. | R'$_1$~R'$_5$ | Z$^\ominus$ | n | X (R$_6$~R$_{15}$) |
|---|---|---|---|---|
| 5' | R'$_1$~R'$_5$ = H | SbF$_6^\ominus$ | 1 | R$_8$, R$_{13}$ = OCH$_2$CH$_2$OH<br>R$_6$, R$_7$, R$_9$~R$_{12}$,<br>R$_{14}$, R$_{15}$ = H |
| 6' | R'$_1$~R'$_5$ = H | PF$_6^\ominus$ | 1 | R$_8$, R$_{13}$ =<br>OCH$_2$CH$_2$OC(O)(CH$_2$)$_5$OH<br>R$_6$, R$_7$, R$_9$ ~ R$_{12}$,<br>R$_{14}$, R$_{15}$= H |
| 7' | R' = —S—⌬—X<br>R'$_1$, R'$_2$, R', R'$_5$, H | SbF$_6^\ominus$ | 2 | R$_8$, R$_{13}$ = F<br>R$_6$, R$_7$, R$_9$~R$_{12}$,<br>R$_{14}$, R$_{15}$ = H |

Examples of the acridone based sulfonium salt include sulfonium salts represented by the following formula (14):

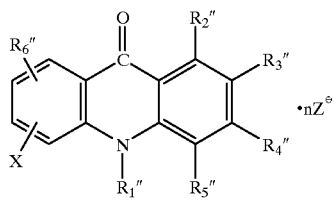

(14)

{wherein X is the group as defined by the aforementioned formula (5), R"1 is a C$_1$–C$_{10}$ alkyl group, each of R"$_2$ to R"$_6$ is a group selected from a hydrogen atom, a hydroxyl group, a C$_1$–C$_{15}$ aliphatic group, a halogen atom, a nitro group, an alkoxy group, an ester group, a phenyl group and a group represented by the formula (5), n is 1 to 2 and Z is as defined by the aforementioned formula (6) or (7)}.

The compound represented by the formula (14) can be synthesized for example by 1) a method in which a compound represented by the following formula (15):

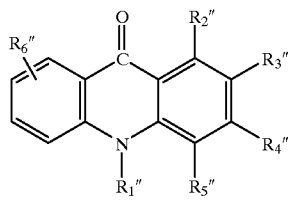

(15)

(wherein R"$_1$ is a C$_1$–C$_{10}$ alkyl group, each of R"$_2$ to R"$_6$ is a group selected from a hydrogen atom, a hydroxyl group, a C$_1$–C$_{15}$ aliphatic group, a halogen atom, a nitro group, an alkoxy group, an ester group and a phenyl group) is allowed to react with a substituted or unsubstituted diphenyl sulfoxide compound making use of a known sulfonyl salt forming reaction (to be referred to as method 1) hereinafter) or 2) a method in which a corresponding substituted or unsubstituted sulfonium salt is synthesized in advance and then a substituent group is converted or introduced (to be referred to as method 2) hereinafter).

Firstly, the method 1) is illustratively described. The sulfonium salt can be obtained by carrying out condensation reaction of an acridone compound represented by the formula (15) (its illustrative examples include N-butyl-2-chloro-9-acridone, N-ethyl-2-chloro-9-acridone, N-butyl-2-methyl-9-acridone, N-ethyl-1-ethyl-2-chloro-9-acridone, N-methyl-2-ethoxy-9-acridone, N-phenyl-2-ethyl-9-acridone, N-butyl-1-methyl-2-propoxy-9-acridone, N-ethyl-2,4-diethyl-9-acridone, N-ethyl-2,4-dipropyl-9-acridone, N-methyl-2-isopropyl-9-acridone, N-butyl-1-propyl-9-acridone, N-phenyl-2-nitro-9-acridone and the like) with a substituted or unsubstituted diphenyl sulfoxide compound (for example, diphenylsulfoxide, 4,4'-difluorodiphenyl sulfoxide, 2,2'-difluorodiphenyl sulfoxide, 3,3'-difluorodiphenyl sulfoxide, 4,2'-difluorodiphenyl sulfoxide, 4,4'-dibromodiphenyl sulfoxide, 4,4'-dichlorodiphenyl sulfoxide, 2,2',4,4'-tetrachlorodiphenyl sulfoxide, 4,4'-dimethyldiphenyl sulfoxide, 4,4'-diethyldiphenyl sulfoxide, 4,4'-dimethoxydiphenyl sulfoxide, 4-methylthiodiphenyl sulfoxide, 4-phenylthiodiphenyl sulfoxide or the like) by a known method, for example at ordinary temperature to 100° C. using a dehydrating agent (for example, phosphorus pentaoxide, acetic anhydride, concentrated sulfuric acid or the like) and methanesulfonic acid or perfluoromethanesulfonic acid as a solvent, and then adding the resulting reaction solution dropwise to an aqueous solution of an alkali metal salt having the anion moiety of formula (6) or (7) (for example, NaSbF$_6$, NaPF$_6$, NaAsF$_6$, NaBF$_4$, NaSbF$_5$OH, KSbF$_6$, KPF$_6$, KAsF$_6$, KSbF$_5$OH, LiB(C$_6$F$_5$)$_4$, LiB(C$_6$F$_5$)$_2$F$_2$, LiB(C$_6$H$_4$CF$_3$)$_4$, LiBF$_3$(C$_6$F$_5$), NaB(C$_6$F$_5$)$_4$ or the like).

In illustratively describing the method 2), a sulfonium salt synthesized by the method 1), for example a halide compound represented by a formula (16):

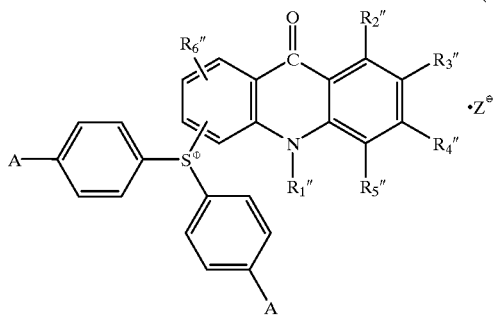

(16)

(wherein R″₁ to R″₆ are the same as the R″₁ to R″₆ of the formula (15), A is a halogen atom, and Z is as defined by the aforementioned formula (6) or (7)), is allowed to react with a large excess of a mono or polyalcohol (for example, methanol, ethanol, carbitol, ethylene glycol, polyethylene glycol, propylene glycol, glycerol, trimethylolpropane, 1,4-butanediol, glycidol, 2-hydroxyethyl (meth)acrylate, 2-hydroxypropyl (meth)acrylate, allyl alcohol or the like) by a known method, for example in the presence of a basic compound (for example, sodium hydroxide, potassium hydroxide, potassium carbonate or the like) at room temperature to 150° C., if necessary in the presence of dimethyl sulfoxide or the like organic solvent, thereby obtaining a sulfonium salt in which the halide moiety of the aforementioned halide compound is substituted for example with

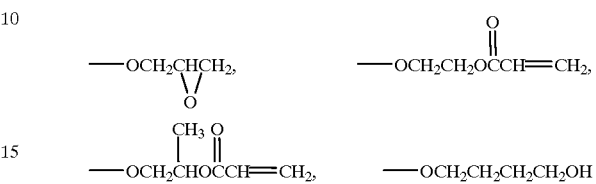

or the like substituent group.

Though not particularly limited, the compounds shown in Table 3 can be cited as typical examples of the compound represented by the general formula (14).

TABLE 3

| No. | R″₁ | R″₂–R″₆ | $Z^\ominus$ | n | X ($R_6$–$R_{15}$) |
|---|---|---|---|---|---|
| 1″ | $C_2H_5$ | R″₃ = $OC_2H_5$ <br> R″₂, R″₄, R″₅, R″₆ = H | $SbF_6^\ominus$ | 1 | $R_8, R_{13}$ = F <br> $R_6, R_7, R_9$–$R_{12}, R_{14}, R_{15}$ = H |
| 2″ | $CH_3$ | R″₃ = $C_3H_7$ <br> R″₂, R″₄, R″₅, R″₆ = H | $PF_6^\ominus$ | 1 | $R_8, R_{13}$ = F <br> $R_6, R_7, R_9$–$R_{12}, R_{14}, R_{15}$ = H |
| 3″ | $C_4H_9$ | R″₂ = $CH_3$, R″₃ = $OC_3H_7$ <br> R″₄, R″₅, R″₆ = H | $SbF_6^\ominus$ | 1 | $R_8, R_{13}$ = $CH_3$ <br> $R_6, R_7, R_9$–$R_{12}, R_{14}, R_{15}$ = H |
| 4″ | $C_4H_9$ | R″₃ = Cl <br> R″₂, R″₄, R″₅, R″₆ = H | $PF_6^\ominus$ | 1 | $R_8, R_{13}$ = $OCH_3$ <br> $R_6, R_7, R_9$–$R_{12}, R_{14}, R_{15}$ = H |
| 5″ | $C_4H_9$ | R″₃ = X <br> R″₂, R″₄, R″₅, R″₆ = H | $PF_6^\ominus$ | 1 | $R_8, R_{13}$ = F <br> $R_6, R_7, R_9$–$R_{12}, R_{14}, R_{15}$ = H |
| 6″ | $C_4H_9$ | R″₃ = Cl <br> R″₂, R″₄, R″₅, R″₆ = H | $SbF_6^\ominus$ | 1 | $R_7, R_{13}$ = $OCH_2CH\overset{\diagdown}{\underset{O}{\diagup}}CH_2$ <br> $R_6, R_7, R_9$–$R_{12}, R_{14}, R_{15}$ = H |
| 7″ | $C_4H_9$ | R″₃ = Cl <br> R″₂, R″₄, R″₅, R″₆ = H | $PF_6^\ominus$ | 1 | $R_9, R_{13}$ = $OCH_2CH_2OCCHCH_2$ (C=O) <br> $R_6, R_7, R_9$–$R_{12}, R_{14}, R_{15}$ = H |
| 8″ | ″ | R″₃ = Cl <br> R″₂, R″₄, R″₅, R″₆ = H | $BF_3(C_6H_5)$ | 1 | $R_9, R_{13}$ = $OCH_2CH_2OCCHCH_2$ (C=O) <br> $R_6, R_7, R_9$–$R_{12}, R_{14}, R_{15}$ = H |

The onium salts of No. 6, No. 8, No. 11, No. 12, No. 13, No. 14 and No. 15 and the like, which are sulfonyl salts having the thioxanthone structure, can be exemplified as particularly preferred onium salts of the present invention. A sulfonyl salt having the thioxanthone structure is most desirable. It was found that the onium salt (B) of the present invention has significant sensitivity to ultraviolet rays of a certain wave length which is not absorbed by white pigments such as titanium dioxide and rutile-type titanium dioxide coated with aluminum oxide as will be described later. That is, it was discovered that these onium salts have a broad range of absorption spectrum within the wave length of from 300 to 500 nm. When there is no absorption or maximum molar absorption coefficient is 50 or less at a wave length of 360 nm or more, the composition is not hardened or its hardening becomes slow. The photocationic polymerization initiator (B) to be used in the present invention has a maximum molar absorption coefficient of generally 50 or more, preferably 500 or more, more preferably 1,000 or more, most preferably 2,000 or more, at a wave length of 360 nm or more.

According to the present invention, it is possible to use a combined photocationic polymerization initiator which is a combination of an onium salt (B') having a maximum molar absorption coefficient of 10,000 or more at a wave length of 360 nm or less and the onium salt (B) having a maximum molar absorption coefficient of 50 or more at a wave length of 360 nm or more. In this connection, an onium salt having a maximum molar absorption coefficient of 10,000 or less at a wave length of 360 nm or less will bear no hardening of the composition or its hardening will be delayed.

Illustrative examples of the onium salt (B') having a maximum molar absorption coefficient of 10,000 or more at a wave length of 360 nm or less include known triphenyl hexafluorophosphate, triphenyl hexafluoroantimonate, diphenyl-4-thiophenoxyphenylsulfonium hexafluorophosphate, diphenyl-4-thiophenoxyphenylsulfonium hexafluoroantimonate, 4,4'-bis[bisphenylsulfonio]phenylsulfido bishexafluorophosphate, 4,4'-bis[bisphenylsulfonio] phenylsulfido bishexafluoroantimonate,

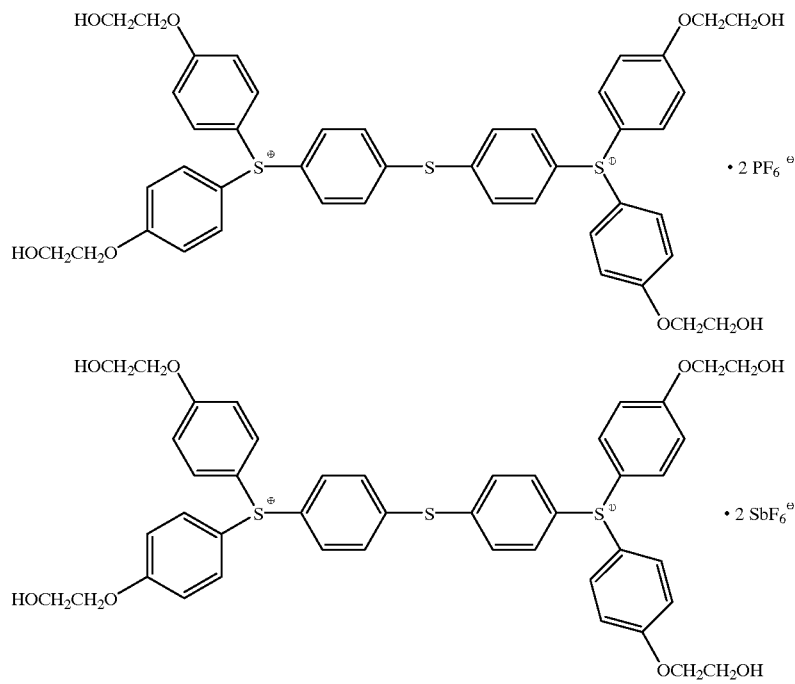

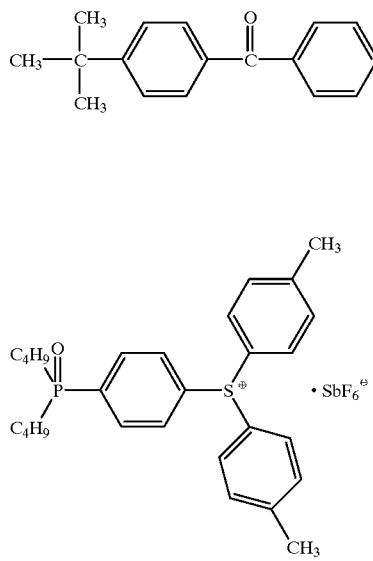

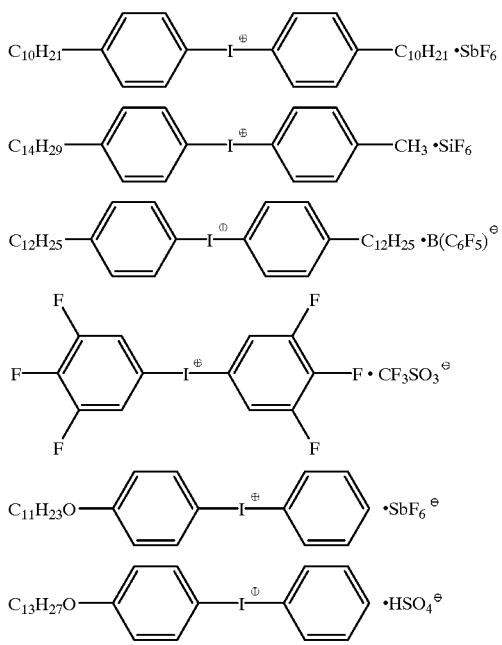

and the like sulfonium salts or known diphenyliodonium hexafluorophosphate, diphenyliodonium hexafluoroantimonate, $C_{10}H_{21}$—〔〕—I⊕—〔〕—$C_{10}H_{21}$ •SbF$_6^⊖$ $C_{14}H_{29}$—〔〕—I⊕—〔〕—$CH_3$ •SiF$_6$ $C_{12}H_{25}$—〔〕—I⊕—〔〕—$C_{12}H_{25}$ •B(C$_6$F$_5$)$^⊖$

F-〔F,F〕—I⊕—〔F,F〕—F • CF$_3$SO$_3^⊖$ $C_{11}H_{23}$O—〔〕—I⊕—〔〕 •SbF$_6^⊖$ $C_{13}H_{27}$O—〔〕—I⊕—〔〕 •HSO$_4^⊖$ and the like iodonium salts.

Among these salts, it is desirable to use a mixture of a sulfonium salt of a thioxanthone compound with a sulfonium salt or iodonium salt of other compound than thioxanthone.

A pigment (C) is used in the present invention. Illustrative examples of the pigment (C) include black pigments
carbon black, acetylene black, lamp black, aniline black;

yellow pigments
chrome yellow, zinc yellow, cadmium yellow, yellow iron oxide, Mineral Fast Yellow, nickel titanium yellow, naples yellow, Naphthol Yellow S, Hansa Yellow G, Hansa Yellow 10G, Benzidine Yellow G, Benzidine Yellow GR, quinoline yellow lake, Permanent Yellow NCG, Tartrazine Lake;

orange pigments
reddish chrome yellow, molybdenum orange, Permanent Orange GTR, Pyrazolone Orange, Vulcan Orange, Indanthrene Brilliant Orange GK;

red pigments
iron oxide red, cadmium red, red lead, cadmium mercury sulfide, Permanent Red 4R, Lithol Red, Pyrazolone Red, Watchung Red calcium salt, Lake Red D, Brilliant Carmine 6B, eosine lake, Rhodamine Lake B, alizarine lake, Brilliant Carmine 3B;

violet pigments
manganese violet, Fast Violet B, Methyl Violet Lake;

blue pigments
iron blue, cobalt blue, Alkali Blue Lake, Victoria Blue Lake, Phthalocyanine Blue, metal-free Phthalocyanine Blue, Phthalocyanine Blue partial chloride, Fast Sky Blue, Indanthrene Blue BC;

green pigments
chrome green, chromium oxide, Pigment Green B, Malachite Green Lake, Fanal Yellow Green G;

white pigments
zinc flower, titanium oxide, antimony white, zinc sulfide;

extender pigments
baryte powder, barium carbonate, clay, silica, white carbon, talc, alumina white and the like inorganic or organic pigments. Among these pigments, titanium dioxide and rutile-type titanium dioxide coated with aluminum oxide are desirable.

Next, the ratio of each of the components (A), (B), (B') and (C) to be used in the composition of the present invention is described.

Firstly, the energy ray curable composition of the present invention can contain the component (A) in an amount of from 34.7 to 98.7% by weight, preferably from 40 to 95% by weight, the component (B) in an amount of from 0.3 to 15% by weight, preferably from 0.5 to 10% by weight and the component (C) in an amount of from 0 to 65% by weight, preferably from 1 to 50% by weight, based on the total composition.

Secondly, the energy ray curable composition of the present invention can contain the component (A) in an amount of from 28 to 99.99% by weight, preferably from 40 to 95% by weight, the component (B) in an amount of from 0.001 to 18% by weight, preferably from 0.25 to 15% by weight, the component (B') in an amount of from 0.001 to 18% by weight, preferably from 0.25 to 15% by weight and the component (C) in an amount of from 0 to 65% by weight, preferably from 1 to 50% by weight, based on the total composition.

Preferred modes of the energy ray hardenable composition of the present invention are described in the following.

A first mode is an energy ray curable composition which contains (1) the aforementioned component (A)

(2) the component (B) and (3) the component (C).

A second mode is an energy ray curable composition which contains (1) the component (A)

(2) the component (B) and the component (B') and if necessary (3) component (C).

Particularly preferred of the first mode is an energy ray curable composition which is characterized in that (1) the cationic polymerizable substance (A) is a monomer or oligomer having at least one functional epoxy group or oxirane ring, (2) the polymerization initiator (B) is a thioxanthone based sulfonium salt of the formula (4), and (4) the pigment (C) is titanium dioxide or rutile-type titanium dioxide coated with aluminum oxide.

Particularly preferred of the second mode are an energy ray curable composition which is characterized in that (1) the cationic polymerizable substance (A) is a monomer or oligomer having at least one functional epoxy group or oxirane ring, (2) the polymerization initiator (B) is a thioxanthone based sulfonium salt of the formula (4), (3) the polymerization initiator (B') is a sulfonium salt or iodonium salt other than (B), and (4) the pigment (C) is titanium dioxide or rutile-type titanium dioxide coated with aluminum oxide, and an energy ray curable composition which is characterized in that (1) the cationic polymerizable substance (A) is a monomer or oligomer having at least one functional epoxy group or oxirane ring, (2) the polymerization initiator (B) is a thioxanthone based sulfonium salt of the formula (4), (3) the polymerization initiator (B') is a sulfonium salt or iodonium salt other than (B), and (4) the pigment (C) is not included.

The energy ray curable composition of the present invention can be prepared by mixing, dissolving and kneading the cationic polymerizable substance (A), photocationic polymerization initiator (B) and/or (B') and pigment (C).

The curable composition of the present invention can be cured into a dry to touch or solvent-insoluble state after 0.1 second to several minutes of irradiation with ultraviolet rays or the like energy rays. As suitable energy rays, it is desirable to use those energy rays which have a wave length of from 20 nm to 500 rim obtained for example from a high pressure or low pressure mercury lamp, a xenon lamp, a metal halide lamp, a germicidal lamp or a laser lamp, though not particularly limited thereto, with the proviso that they have energy to induce decomposition of the photocationic polymerization initiator. In general, approximately from 0.1 to 10 seconds of exposure of the composition to energy rays is sufficient, though it depends on the intensity of the energy rays. However, it is desirable to spend more longer period of time when the coated material is relatively thick. In most cases, the composition is dried to touch by cationic polymerization after 0.1 second to several minutes of energy ray irradiation, but it is desirable in some cases to jointly employ heating in order to accelerate the cationic polymerization reaction.

Within such a range that the cationic polymerization is not spoiled, the composition of the present invention may be blended with solvents for dilution, non-reactive resins for modification(for example, acrylic polymer, polyurethane polymer, polyester elastomer, polyvinyl chloride polymer, acrylonitrile rubber and the like), sensitizers (for example, 2-isopropylthioxanthone, 2-chlorothioxanthone, 2,4-diethylthioxanthone, 4-phenylcarbonyldiphenyl sulfide, benzophenone, anthracene, phenothiazine and the like) and (meth)acrylic ester compounds (for example, epoxy (meth) acrylates as the reaction products of bisphenol A epoxy resin, novolak epoxy resin and the like epoxy resins with (meth)acrylic acid, reaction products of these epoxy (meth) acrylates with polybasic acid anhydrides (for example, succinic anhydride, tetrahydrophthalic anhydride, hexahydrophthalic anhydride and the like), urethane (meth)acrylate, polyester poly(meth)acrylate and the like oligomers, and 2-hydroxyethyl (meth)acrylate, 1,6-hexanediol (meth) acrylate, nonanediol (meth)acrylate, trimethylolpropane tri (meth)acrylate, pentaerythritol tri(meth)acrylate, pentaerythritol tetra(meth)acrylate, ditrimethylolpropane tetra (meth)acrylate, dipentaerythritol penta or hexa(meth) acrylate and the like monomers). When the (meth)acrylic ester compound is used, it is desirable to use a photoradical polymerization initiator (for example, 1-hydroxycyclohexyl phenyl ketone, acetophenone dimethyl ketal, 2,4,6-trimethylbenzoyldiphenyl-phosphine oxide, bisacylphosphine oxide or the like). In addition, an organic carboxylic acid or an acid anhydride may be used with the purpose, for example, of improving electric characteristics, or a polyol or other flexible prepolymer may be mixed, for example with aim of giving rubber elasticity.

The composition of the present invention may be further mixed with a dyestuff, a filler, an antistatic agent, a flame retardant, an antifoaming agent, a fluidity controlling agent, a light stabilizer, a coupling agent, a organic solvent and the like. The composition of the present invention can be applied to metals, wood, paper, rubbers, plastics, glass, ceramic products and the like. More illustrative examples of the use of the present invention include white ink for use in metal cans such as food cans, various types of printing ink, paints, resist ink, wood fillers and the like.

EXAMPLES

The present invention is described further illustratively with reference to the following examples.

In this connection, the term "part" used in the examples means part by weight.

Synthesis Examples (Synthesis examples of the sulfonium salt represented by the formula (4))

Synthesis Example 1

A container was charged with 50.8 parts of 2-isopropylthioxanthone, 46 parts of 4,4'-dimethyldiphenyl sulfoxide, 200 parts of acetic anhydride and 796 parts of methanesulfonic acid to carry out about 8 hours of reaction at 25° C., the resulting reaction mixture was gradually added dropwise to 1,723.7 parts of an aqueous solution of $NaSbF_6$ (51.7 parts of $NaSbF_6$ dissolved in 1,672 parts of water), and the thus precipitated light yellow solid substance was collected by filtration and washed with water and ethyl ether. The light yellow solid substance was obtained in an amount of 119 parts. Melting point of the product was 82 to 84° C., and results of its elemental analysis were as follows.

| Elements | Found (% by weight) | Calcd. (% by weight) |
| --- | --- | --- |
| Carbon | 51.09 | 51.23 |
| Hydrogen | 3.80 | 3.87 |
| Sulfur | 9.07 | 9.11 |
| Antimony | 17.30 | 17.31 |
| Fluorine | 16.17 | 16.20 |

On the basis of this production method, a sulfonium salt of the following formula was obtained.

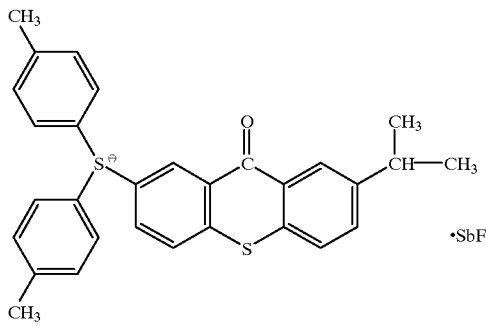

Synthesis Example 2

The treatment of Synthesis Example 1 was repeated, except that 1,723.7 parts of the aqueous solution of $NaSbF_6$ used in Synthesis Example 1 was changed to 1,120 parts of an aqueous solution of $NaPF_6$ (33.6 parts of $NaPF_6$ dissolved in 1,086.4 parts of water), thereby obtaining 104 parts of a light yellow solid substance. Melting point of the product was 83 to 86° C., and results of its elemental analysis were as follows.

| Elements | Found (% by weight) | Calcd. (% by weight) |
| --- | --- | --- |
| Carbon | 58.75 | 58.82 |
| Hydrogen | 4.40 | 4.44 |
| Sulfur | 10.41 | 10.47 |
| Phosphorus | 5.05 | 5.06 |
| Fluorine | 16.16 | 16.20 |

On the basis of this production method, a sulfonium salt of the following formula was obtained.

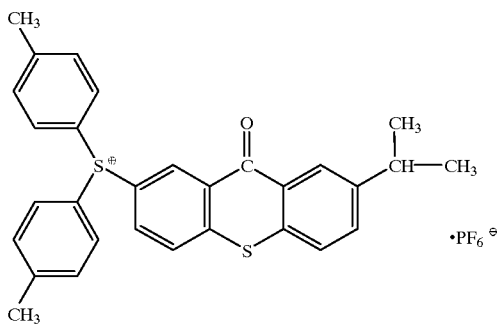

Synthesis Example 3

A container was charged with 13.3 parts of 2-chlorothioxanthone, 12.8 parts of 4,4'-difluorodiphenyl sulfoxide, 10 parts of acetic anhydride and 54 parts of methanesulfonic acid to carry out about 5 hours of reaction at 90° C., the resulting reaction mixture was gradually added dropwise to 124 parts of an aqueous solution of $KSbF_6$ (7 parts of $KSbF_6$ dissolved in 117 parts of water), and the thus precipitated solid substance was collected by filtration and washed with water and ethyl ether. A light yellow solid substance was obtained in an amount of 16.4 parts. Melting point of the product was 218 to 223° C., and results of its elemental analysis were as follows.

| Elements | Found (% by weight) | Calcd. (% by weight) |
| --- | --- | --- |
| Carbon | 36.01 | 36.13 |
| Hydrogen | 2.15 | 2.23 |
| Sulfur | 10.09 | 10.15 |
| Antimony | 19.25 | 19.28 |
| Fluorine | 24.01 | 24.06 |
| Chlorine | 5.57 | 5.61 |

On the basis of this production method, a sulfonium salt of the following formula was obtained.

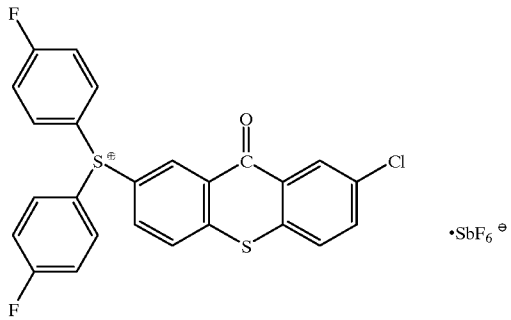

Synthesis Example 4

The treatment of Synthesis Example 3 was repeated, except that 124 parts of the aqueous solution of $KSbF_6$ used in Synthesis Example 3 was changed to 84.8 parts of an aqueous solution of $KPF_6$ (4.8 parts of $KPF_6$ dissolved in 80 parts of water), thereby obtaining 14.1 parts of a light yellow solid substance. Melting point of the product was 201 to 206° C., and results of its elemental analysis were as follows.

| Elements | Found (% by weight) | Calcd. (% by weight) |
|---|---|---|
| Carbon | 42.11 | 42.19 |
| Hydrogen | 2.57 | 2.61 |
| Sulfur | 11.80 | 11.85 |
| Phosphorus | 5.72 | 5.73 |
| Fluorine | 28.08 | 28.10 |
| Chlorine | 6.51 | 6.55 |

On the basis of this production method, a sulfonium salt of the following formula was obtained.

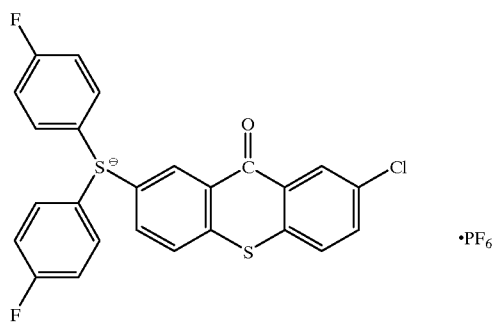

(Synthesis example of the sulfonium salt represented by the formula (10))

Synthesis Example 5

A container was charged with 45.3 parts of 1-phenylthioanthraquinone, 23.8 parts of 4,4'-difluorodiphenyl sulfoxide, 100 parts of acetic anhydride and 398 parts of methanesulfonic acid to carry out about 8 hours of reaction at 25° C., the resulting reaction mixture was gradually added dropwise to 431.1 parts of an aqueous solution of $NaSbF_6$ (25.8 parts of $NaSbF_6$ dissolved in 405.3 parts of water), and the thus precipitated yellow solid substance was collected by filtration and washed with water and ethyl ether. The yellow solid substance was obtained in an amount of 90.4 parts. Melting point of the product was 95.1 to 103.1° C., and results of its elemental analysis were as follows.

| Elements | Found (% by weight) | Calcd. (% by weight) |
|---|---|---|
| Carbon | 44.59 | 44.53 |
| Hydrogen | 2.75 | 2.73 |
| Sulfur | 9.20 | 9.14 |
| Antimony | 17.38 | 17.36 |
| Fluorine | 21.72 | 21.67 |

On the basis of this production method, a sulfonium salt of the following formula was obtained.

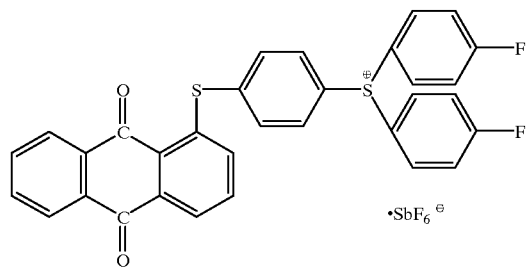

(Synthesis example of the sulfonium salt represented by the formula (14))

Synthesis Example 6

A container was charged with 10.0 parts of N-butyl-2-chloro-9-acridone (manufactured by Kurogane Kasei Co.), 9.2 parts of 4,4'-difluorodiphenyl sulfoxide, 6.0 parts of acetic anhydride and 43.1 parts of methanesulfonic acid to carry out about 8 hours of reaction at 25° C., the resulting reaction mixture was gradually added dropwise to 2,000 parts of an aqueous solution of $NaSbF_6$ (9.5 parts of $NaSbF_6$ dissolved in 1,991.5 parts of water), and the thus precipitated yellow solid substance was collected by filtration and washed with water and ethyl ether. A light yellow solid substance was obtained in an amount of 25.2 parts. Melting point of the product was 167 to 169° C., and results of its elemental analysis were as follows.

| Elements | Found (% by weight) | Calcd. (% by weight) |
|---|---|---|
| Carbon | 46.92 | 46.89 |
| Hydrogen | 3.00 | 3.12 |
| Sulfur | 4.32 | 4.32 |
| Nitrogen | 1.89 | 1.89 |
| Antimony | 16.38 | 16.39 |
| Fluorine | 20.43 | 20.46 |
| Chlorine | 4.77 | 4.81 |

On the basis of this production method, a sulfonium salt of the following formula was obtained.

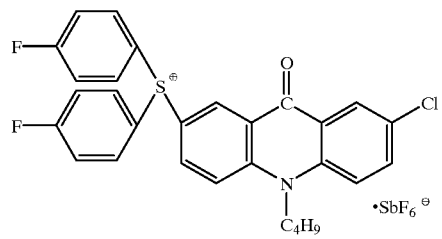

Examples 1 to 3 and Comparative Examples 1 and 2

Components of respective energy ray curable compositions were blended in accordance with the formulation compositions shown in Table 4 (values shown by weight parts), and each of the resulting mixtures was kneaded with a triple roller mill. This was coated on an aluminum plate to a thickness of 10 μm using a bar coater and cured by irradiating ultraviolet rays of a metal halide lamp (80 W/cm²) from a distance of 8 cm. Hardenability of the thus prepared compositions and glossiness of the cured paint films were tested. The results of these tests are also shown in Table 4. Curability: Each of the cured paint films was subjected to 50 times of rubbing with absorbent cotton which has been impregnated with methyl ethyl ketone, and an irradiation dose (mJ/cm$^2$) which did not change the paint film was measured.

Glossiness: After irradiation with a dose (mJ/cm$^2$) which did not change the cured paint film when it was subjected to 50 times of rubbing with absorbent cotton that has been impregnated with methyl ethyl ketone, the surface of the hardened paint film was evaluated with the naked eye.

○ . . . good in glossiness

Δ . . . slightly hazing

X . . . no glossiness at all

TABLE 4

|  | Inv. Ex. | | | Comp. Ex. | |
| --- | --- | --- | --- | --- | --- |
|  | 1 | 2 | 3 | 1 | 2 |
| Cationic polymerizable substance (A) | | | | | |
| 3,4-Epoxycyclohexylmethyl-3, epoxycyclohexane carboxylate | 50 | 45 | 45 | 45 | 45 |
| Bisphenol A diglycidyl ether |  | 10 | 10 | 10 | 10 |
| Pigment (C) | | | | | |
| Titanium dioxide | 50 | 45 | 45 | 45 | 45 |
| Photocationic polymerization initiator (B) | | | | | |
| SP-170 *1 |  |  |  | 5 |  |
| UVI-6990 *2 |  |  |  |  | 6 |
| PCI-019T *3 | 3 |  |  |  |  |
| PCI-021T *4 |  | 3 |  |  |  |
| PCI-061T *5 |  |  | 3 |  |  |
| BYKP-108 (dispersing agent) *6 | 0.5 | 0.5 | 0.5 | 0.5 | 0.5 |
| (leveling agent) *7 | 1.0 | 1.0 | 1.0 | 1.0 | 1.0 |
| Curability (mJ/cm$^2$) | 137 | 400 | 92 | 450 | 1110 |
| Glossiness | ○ | ○ | ○ | X | X |

Note)
*1 SP-170: A photocationic polymerization initiator mfd. by Asahi Denka Kogyo Co., 40% diluted with propylene carbonate, no absorption at a wave length of 360 nm or more.
*2 UVI-6990: A photocationic polymerization initiator mfd. by Union Carbide Co., 50% diluted with propylene carbonate, no absorption at a wave length of 360 nm or more.
*3 PCI-019T: A photocationic polymerization initiator mfd. by Nippon Kayaku Co. Yellow powder having a molar absorption coefficient of 4,170 at a wave length of 387 nm and having the following structural formula.

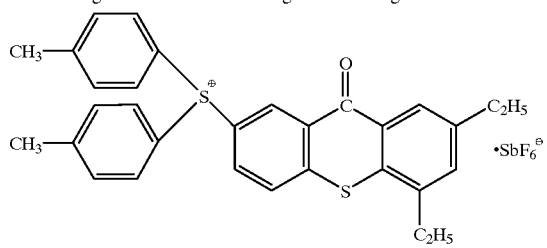

*4 PCI-021T: A photocationic polymerization initiator mfd. by Nippon Kayaku Co. Yellow powder having a molar absorption coefficient of 3,840 at a wave length of 385 nm and having the following structural formula.

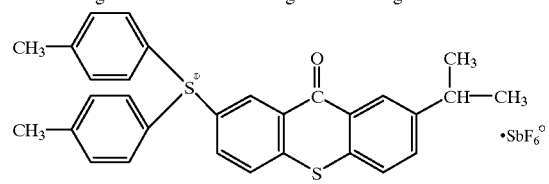

*5 PCT-061T: A photocationic polymerization initiator mfd. by Nippon Kayaku Co. Yellow powder having a molar absorption coefficient of 4,730 at a wave length of 385 nm and having the following structural formula.

As is evident from the results shown in Table 4, the composition of the present invention is excellent in curability and glossiness.

Examples 4 to 8 and Comparative Examples 3 and 4

Components of respective energy ray curable compositions were blended in accordance with the formulation compositions shown in Table 5 (values shown by weight parts), and each of the resulting mixtures was mixed and dispersed. This was coated on a sheet of coat paper at a thickness of 5 μm and cured by irradiating ultraviolet rays of a metal halide lamp (80 W/cm$^2$) from a distance of 8 cm. Curability of the thus prepared compositions and glossiness of the cured paint films were tested. The results of these tests are also shown in Table 5.

Curability: The irradiation dose (mJ/cm$^2$) until dried to touch was measured.

Glossiness: After irradiation with a dose (mJ/cm$^2$) until dried to touch, the surface of the cured paint film was evaluated with the naked eye.

○ . . . good in glossiness

Δ . . . slightly hazing

X . . . no glossiness at all

TABLE 5

|  | Ex. | | | | | Comp. Ex. | |
| --- | --- | --- | --- | --- | --- | --- | --- |
|  | 4 | 5 | 6 | 7 | 8 | 3 | 4 |
| Cationic polymerizable substance (A) | | | | | | | |
| EHPE-3150 *1 | 20 | 20 | 20 | 20 | 20 | 20 | 20 |
| Celoxide 2021 *2 | 80 | 80 | 80 | 80 | 80 | 80 | 80 |
| Photocationic polymerization initiator | | | | | | | |
| Onium salt (B') | | | | | | | |
| SP-170 *3 | 4 | 4 | | | | 6.7 | |
| UVI-6990 *4 | | | 5 | 5 | 5 | | 8 |
| Onium salt (B) | | | | | | | |
| PCI-019 *5 | 1.5 | | 1.5 | | | | |
| PCI-021 *6 | | 1.5 | | | | | |
| PCI-061 T *7 | | | | 1.5 | | | |
| PCI-063 *8 | | | | | 1.5 | | |
| Titanium oxide | 100 | 100 | 100 | 100 | 100 | 100 | 100 |
| Curability (mJ/cm$^2$) | 137 | 137 | 137 | 100 | 100 | 200 | 321 |
| Glossiness | ○ | ○ | ○ | ○ | ○ | ○ | ○ |

Note)
*1 EHPE-3150: An alicyclic epoxy resin mfd. by Daicel Chemical Industries Co.
*2 Celoxide 2021: An alicyclic epoxy resin mfd. by Daicel Chemical Industries Co.
*3 SP-170: A photocationic polymerization initiator mfd. by Asahi Denka Kogyo Co., 40% diluted with propylene carbonate, having a molar absorption coefficient of 43,500 at a wave length of 268 nm and having the following structural formula.

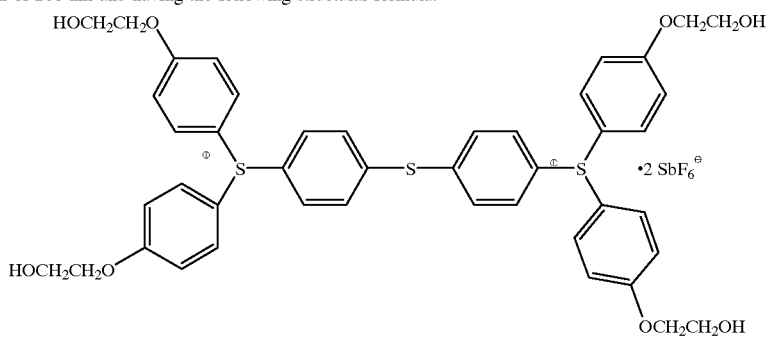

*4 UVI-6990: A photocationic polymerization initiator mfd. by Union Carbide Co., 50% diluted with propylene carbonate, a mixture of the following structural formulae.

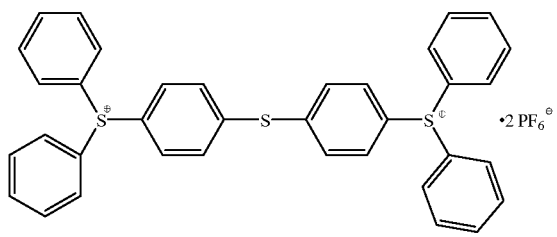

and

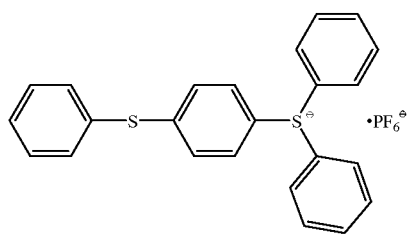

*5 PCI-019: A photocationic polymerization initiator mfd. by Nippon Kayaku Co. Yellow powder having a molar absorption coefficient of 5,370 at a wave length of 385 nm and having the following structural formula.

TABLE 5-continued

|  | Ex. |  |  |  |  | Comp. Ex. |  |
|---|---|---|---|---|---|---|---|
|  | 4 | 5 | 6 | 7 | 8 | 3 | 4 |

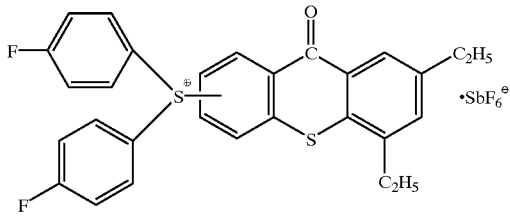

*6 PCI-021: A photocationic polymerization initiator mfd. by Nippon Kayaku Co. Yellow powder having a molar absorption coefficient of 5,090 at a wave length of 388 nm and having the following structural formula.

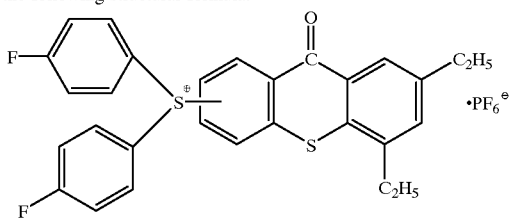

*7 PCI-061T: A photocationic polymerization initiator mfd. by Nippon Kayaku Co. Light yellow powder having a molar absorption coefficient of 4,730 at a wave length of 385 nm and having the following structural formula.

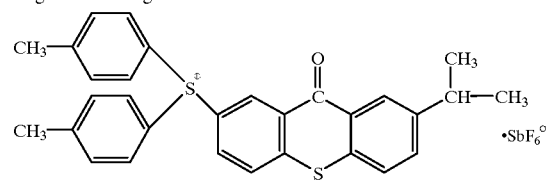

*8 PCI-063: A photocationic polymerization initiator mfd. by Nippon Kayaku Co. Light yellow powder having a molar absorption coefficient of 4,950 at a wave length of 385 nm and having the following structural formula.

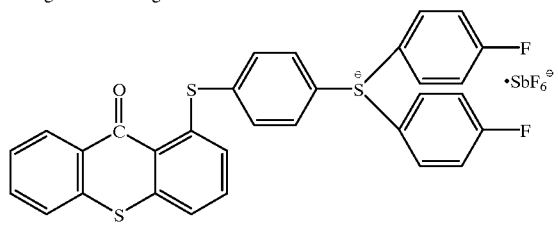

As is evident from the results shown in Table 5, the composition of the present invention is excellent in curability.

Effects of the Invention

The energy ray curable composition of the present invention is excellent in curability, particularly in the case of a colored composition, and can provide cured products having excellent physical properties.

We claim:

1. An energy ray curable composition which comprises
   (1) a cationic polymerizable substance (A);
   (2) a photopolymerization initiator (B) which is an onium salt having a maximum molar absorption coefficient of 50 or more at a wave length of 360 nm or more, or a combined photopolymerization initiator of (B) with a polymerization initiator (B') which is an onium salt having a maximum molar absorption coefficient of 10,000 or more at a wave length of 360 nm or less; and if necessary
   (3) a pigment (C).

2. The energy ray curable composition according to claim 1 wherein it contains
   (1) the component (A);
   (2) the component (B); and
   (3) the component (C).

3. The energy ray curable composition according to claim 1 wherein it contains
   (1) the component (A);
   (2) the component (B) and the component (B'); and if necessary
   (3) component (C).

4. The energy ray curable composition according to any one of claims 1 to 3 wherein the component (A) is a monomer or oligomer having at least one functional epoxy group or oxirane ring.

5. The energy ray curable composition according to claim 1, wherein the component (B) is a thioxanthone based sulfonium salt compound.

6. The energy ray curable composition according to claim 1, wherein the component (B) is a thioxanthone based sulfonium salt and the component (B') is a sulfonium salt or iodonium salt other than the component (B).

7. The energy ray curable composition according to claim 1 wherein the component (B) is a thioxanthone based sulfonium salt represented by the following formula (4)

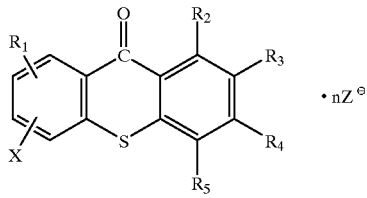

wherein X is a group represented by the following formula (5)

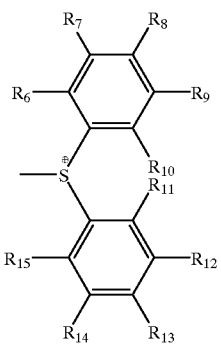

wherein each of $R_6$ to $R_{15}$ is a group selected from a hydrogen atom, a halogen atom, a nitro group, an alkoxy group, an aliphatic group having a $C_1$–$C_{20}$ structure which may have a hydroxyl group, an ether group, an ester group, a (meth)acryloyl group, an epoxy group or an allyl group, a phenyl group, a phenoxy group and a thiophenoxy group, each of $R_1$ to $R_5$ is a group selected from a hydrogen atom, a hydroxyl group, a $C_1$–$C_{15}$ aliphatic group, a halogen atom, a nitro group, an alkoxy group, a phenyl group and a group represented by the formula (5), n is 1 to 4, Z is an anion represented by a formula (6):

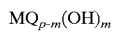 (6)

wherein M is a phosphorus atom, an arsenic atom or an antimony atom, Q is a halogen atom, p is an integer of 4 to 6 and m is 0 or 1, or by a formula (7):

 (7)

wherein B is a boron atom, a and b are integers within the range of from 0 to 4, wherein a+b=4, Y is a halogen atom or a hydroxyl group and P is a phenyl group substituted with at least one electron attractive group or at least two halogen atoms, and n is 1 or 2.

8. The energy ray curable composition according to claim 1 wherein the component (B) is an anthraquinone based sulfonium salt represented by the following formula (10)

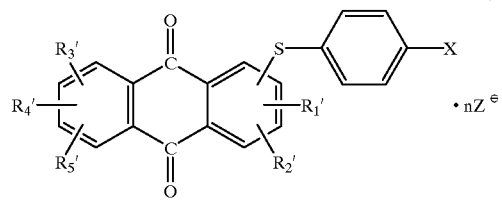

wherein X is the group as defined by the formula (5), each of $R'_1$ to $R'_5$ is a group selected from a hydrogen atom, a hydroxyl group, a $C_1$–$C_{15}$ aliphatic group, a nitro group, an alkoxy group, a phenyl group and a group represented by a formula (11),

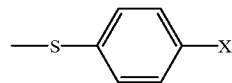

n is 1 to 4 and Z is as defined by the formula (6) or (7).

9. The energy ray curable composition according to claim 1 wherein the component (B) is an acridone based sulfonium salt represented by the following formula (14):

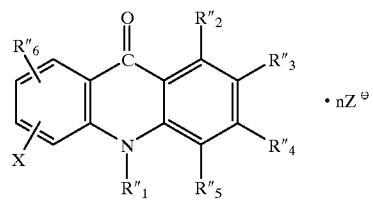

wherein X is the group as defined by the formula (5), $R''_1$ is a $C_1$–$C_{10}$ alkyl group, each of $R''_2$ to $R''_6$ is a group selected from a hydrogen atom, a hydroxyl group, a $C_1$–$C_{15}$ aliphatic group, a halogen atom, a nitro group, an alkoxy group, an ester group, a phenyl group and a group represented by the formula (5), n is 1 to 2 and Z is as defined by the formula (6) or (7).

10. The energy ray curable composition according to claim 1 wherein the component (C) is titanium dioxide or rutile-type titanium dioxide coated with aluminum oxide.

11. The energy ray curable composition according to claim 1 wherein (1) the cationic polymerizable substance (A) is a monomer or oligomer having at least one functional epoxy group or oxirane ring,
(2) the polymerization initiator (B) is a thioxanthone based sulfonium salt of the formula (4), and
(3) the pigment (C) is titanium dioxide or rutile-type titanium dioxide coated with aluminum oxide.

12. The energy ray curable composition according to claim 1 wherein
   (1) the cationic polymerizable substance (A) is a monomer or oligomer having at least one functional epoxy group or oxirane ring,
   (2) the polymerization initiator (B) is a thioxanthone based sulfonium salt of the formula (4),
   (3) the polymerization initiator (B') is a sulfonium salt or iodonium salt other than (B), and
   (4) the pigment (C) is titanium dioxide or rutile-type titanium dioxide coated with aluminum oxide.

13. The energy ray curable composition according to claim 1 wherein
   (1) the cationic polymerizable substance (A) is a monomer or oligomer having at least one functional epoxy group or oxirane ring,
   (2) the polymerization initiator (B) is a thioxanthone based sulfonium salt of the formula (4),
   (3) the polymerization initiator (B') is a sulfonium salt or iodonium salt other than (B), and
   (4) the component (C) is not included.

14. The energy ray curable composition according to claim 2 wherein it contains the component (A) in an amount of from 34.7 to 98.7% by weight, the component (B) in an amount of from 0.3 to 15% by weight and the component (C) in an amount of from 1 to 65% by weight, based on the total composition.

15. The energy ray curable composition according to claim 3 wherein it contains the component (A) in an amount of from 28 to 99.99% by weight, the component (B) in an amount of from 0.001 to 18% by weight, the component (B') in an amount of from 0.001 to 18% by weight and the component (C) in an amount of from 0 to 65% by weight, based on the total composition.

16. The energy ray curable composition according to claim 1, wherein the polymerization initiator (B) is selected from compounds of the following formulae

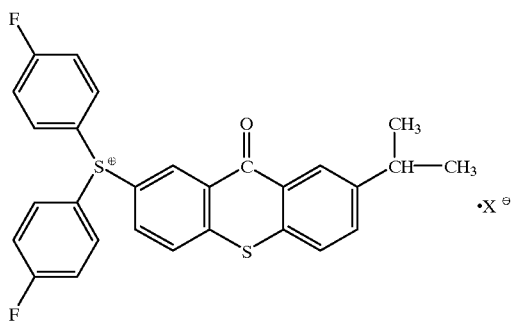

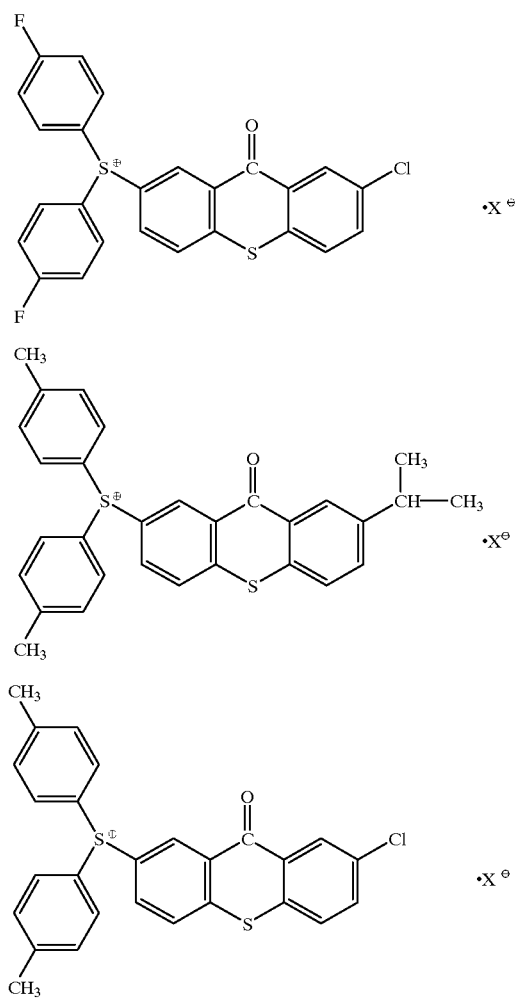

wherein $X^{(-)}$ represents $SbF_6^{(-)}$, $PF_6^{(-)}$ or $B(C_6F_5)_4^{(-)}$.

17. An ink or paint which contains the energy ray curable composition of claim 1, or a cured product thereof.

* * * * *